United States Patent [19]

Emmert

[11] Patent Number: 4,600,298
[45] Date of Patent: Jul. 15, 1986

[54] PIVOTAL LOCKING ARM FOR PHOTOTOOL ASSEMBLY

[75] Inventor: Richard L. Emmert, New Kensington, Pa.

[73] Assignee: PPG Industries, Inc., Pittsburgh, Pa.

[21] Appl. No.: 585,081

[22] Filed: Mar. 1, 1984

[51] Int. Cl.⁴ .............................................. G03B 27/62
[52] U.S. Cl. ..................................... 355/75; 248/463; 355/122
[58] Field of Search ........................ 355/75, 76, 79, 91, 355/93, 89, 132, 122; 248/444.1, 447, 454, 455, 463; 354/349

[56] References Cited

U.S. PATENT DOCUMENTS

| | | | |
|---|---|---|---|
| 637,745 | 11/1899 | Brouse | 248/463 X |
| 749,783 | 1/1904 | Foster | 248/455 |
| 2,844,896 | 7/1958 | Kuruc | 248/454 X |
| 3,043,204 | 7/1962 | Benson | 355/93 X |
| 3,634,009 | 10/1969 | Van Dusen et al. | 355/93 |
| 3,644,039 | 2/1972 | Boyer | 355/93 X |
| 3,645,621 | 2/1972 | Wally | 355/76 |
| 3,734,615 | 5/1973 | Wally | 355/76 |
| 3,927,943 | 12/1975 | Pohl et al. | 355/132 |
| 4,032,233 | 6/1977 | Oscarsson et al. | 355/91 |
| 4,159,176 | 6/1979 | de Masi | 355/79 |
| 4,412,739 | 11/1983 | Freiberg | 355/89 |

Primary Examiner—Richard A. Wintercorn
Attorney, Agent, or Firm—Donna L. Seidel

[57] ABSTRACT

A photomask assembly and method of use are disclosed wherein a hinged pair of plates may be held in an open position by means of a movable arm mounted on one of the plates.

13 Claims, 2 Drawing Figures

PIVOTAL LOCKING ARM FOR PHOTOTOOL ASSEMBLY

BACKGROUND

The present invention relates generally to the art of producing printed circuits and similar products by photolithographic imaging processes using photomasks, and relates more particularly to the art of improving the efficiency of such processes by means of improved phototool assembly designs.

DISCUSSION OF THE TECHNOLOGY

A printed circuit board comprises a substrate of insulator material and a circuit pattern of conductive material on one or both surfaces, commonly formed by photolithographic processes. For example, a fiberglass board to be printed with circuitry is plated with copper and coated with a layer of photoresist material, a photosensitive polymer. The coated surface is then exposed to actinic radiation through a photomask master, a plate with some areas which are transparent to the actinic radiation and some areas which are not, to define the desired circuit pattern. The pattern is developed as a relief image in the photoresist by chemical treatment, the exposed and unexposed portions of the photosensitive polymer having different solubilities. The printed substrate may be either a positive or negative image of the photomask master depending upon whether a positive or negative working photopolymer is used. Typically, with a negative working photoresist, the unexposed photoresist is removed and the underlying copper etched away to leave a pattern of conductive copper in the image of the transparent pattern of the photomask.

Photomasks currently used in photolithographic processes, such as the manufacture of printed circuits, can be diazo or silver halide film, but are preferably glass plates coated with photographic emulsion, iron oxide, silicon, or chromium, having a pattern of transparent and opaque areas with respect to actinic radiation. The photomasks must be repeatedly registered in relation to photoresist coated substrates to accurately reproduce the desired pattern in the proper position. For this reason, durable but opaque coating materials such as chromium may be less preferred than less durable coating materials which are transparent with respect to visible light to facilitate alignment. The visually aligned assembly is exposed to actinic radiation which passes through the transparent areas of the photomask to photographically impose a pattern on the photoresist coated substrate, which is typically developed as a relief image by dissolution of the unexposed photosensitive material. However, in the alternative, the exposed coating material may be removed by dissolution, or either the exposed or unexposed areas may be chemically treated. The chemistry of photolithographic processes is well-known, and any one of the conventional routes is acceptable to arrive at a circuit pattern on the substrate.

For high volume production, more durable photomasks have been developed wherein the pattern is a stained image within a glass plate, rather than a coating. These photomasks may be used many times in a photolithographic process to produce high resolution patterns without breakdown of the photomask pattern. In many current applications, it is also useful to reduce the size of printed circuit boards, requiring either an increase in the density of conductive lines and a reduction in the width of the lines, which requires increasing resolution, or producing patterns on both sides of a substrate. Both increasing the resolution of a dense pattern and simultaneously printing both sides of a circuit board require that photomasks be precisely registered. Particularly when both sides of a photoresist coated substrate are to be exposed simultaneously, a durable dual photomask assembly which can maintain precise registration and can be repeatedly realigned quickly and precisely is required.

An apparatus typically employed in the photolithographic processes described above generally comprises a pair of frames defining an enclosed space which can be evacuated. A pair of flexible photolithographic film masters may be visually aligned and then manually secured individually to the frame members by such devices as tapes, clamps or spring clips. Glass photomasks, on the other hand, are typically registered using cylindrical alignment pins fitted through holes drilled through corresponding areas of the glass plates. A photopolymer coated substrate is precisely registered between the photomasks, and the assembly is covered with a flexible blanket such as a plastic sheet. The area under the blanket is evacuated in order to bring the photomask and substrate into intimate contact so as to optimize resolution. If both sides of the substrate are to be printed, both the blanket and the support on which the assembly rests must be transparent to actinic radiation. When glass photomasks are used, in order to remove the exposed substrate for development, the top glass plate must be lifted vertically and set aside until is is replaced over another unexposed substrate. This process is costly and time-consuming, with the glass exposed to high risk of breakage. Therefore, improvements to the visual-manual registration techinque have been sought.

For example, U.S. Pat. No. 3,634,009 to Van Dusen et al discloses a method and device for accurately registering masters in operative relation in vacuum frame and photocomposition units. The invention involves an improvement in the provision of a metal strip cemented to the underside of a resilient rubber mat in the vacuum frame unit, together with two spring loaded locating pins projecting from the strip through the rubber mat and further through holes accurately punched in corresponding relation in photosensitive sheets of film art masters to effectively locate the sheet of film in extremely accurate relation on the mat to facilitate repeated accuracy in the development of such art work.

U.S. Pat. No. 4,159,176 to de Masi describes an exposure frame for aligning and holding flexible photomasks in registration with a printed circuit board coated with light sensitive material. The board is held between an independently adjustable mounting strip and slides. A contact strip is floated on the mounting strip by a spring mounting to permit the slides to position the printed circuit board relative to the photomask which is mounted on the adjustable mounting strip.

U.S. Pat. No. 4,032,233 to Oscarsson et al describes an apparatus which facilitates the registry of image bearing transparencies with a plate having a photosensitive coating thereon. The registry apparatus includes upper and lower frames forming an enclosure on which the plate and transparencies are placed in sandwich relation. An outer gasket between the frames permits a vacuum to be applied to the enclosed space, while an inner perimeter channel permits a separate vacuum to hold the transparencies in place while the frames are opened to remove, insert or replace a plate, so that successive plates may be processed without registering the transparencies prior to each exposure.

U.S. Pat. No. 3,927,943 to Pohl et al discloses the accomplishment of precisely aligned contact printing on opposite sides of a sensitized substrate by mounting first and second masks in first and second support members, adjusting the first support member to align the masks with respect to a common alignment pin, removing the second support member, mounting the substrate in a third support member, aligning the substrate with the first mask, forcing the substrate into contact with the first mask and magnetically holding it in place, removing the third support member, fastening the second support member to the first support member with the alignment pin, and drawing a vacuum between the masks to bring them into contact with opposite sides of the substrate. This technique provides mutual registration of the masks and substrate so that accurate photolithographic exposure of both sides of the substrate can be accomplished.

U.S. Pat. No. 3,645,621 to Wally discloses a camera-projector having a frame-enclosed transparent platen, the peripheral edge of the platen being spaced from the frame to provide a continuous channel connected to an evacuating pump. The frame has registration pins by which film is located on the platen with its margin over the channel, and the edge of the platen is notched at spaced intervals to promote vacuum pull down of the film flat against the platen surface.

U.S. Pat. No. 3,734,615 to Wally discloses a condenser lens system of a camera-projector having a rectangular channel in a first surface connected to an evacuating pump which adapts said surface as a film platen, and a plate embedded in said surface along one side of the channel having means for orienting a film on said surface. The plate has an inner wall along its length positioned so as to form a space with the part of the channel in which it is positioned for the passage of air.

U.S. Pat. No. 4,412,739 to Freiberg discloses a method and article for facilitating repeated use, in a photolithographic imaging process, of a photomask assembly comprising a pair of glass plates by means of a flexible polymeric hinge permanently joining the pair of glass plates.

In use, the photomask assemblies of the prior art require one operator to lift the top plate and hold it in the open position while a second operator inserts, removes or replaces a substrate. The hinged photomask of Freiberg is suitable for adaptation in accordance with the present invention, and the teaching of this reference, commonly assigned, is incorporated herein by reference.

SUMMARY OF THE INVENTION

The present invention provides a photomask assembly comprising a hinged pair of plates with a movable arm attached to one of the plates. When the plates are in a closed position, i.e., in parallel facing relation spaced apart by approximately the thickness of a substrate to be processed, the arm is in a position which does not interfere with said relation. When the assembly is in an open position, the arm achieves an angled position with respect to the plates in order to hold the plates in the open position, thereby allowing a single operator to open the assembly and remove, insert or replace a substrate while the plates are locked in the open position by means of the movable arm device of the present invention.

DETAILED DESCRIPTION OF THE PREFERRED EMBODIMENTS

Figure 1:
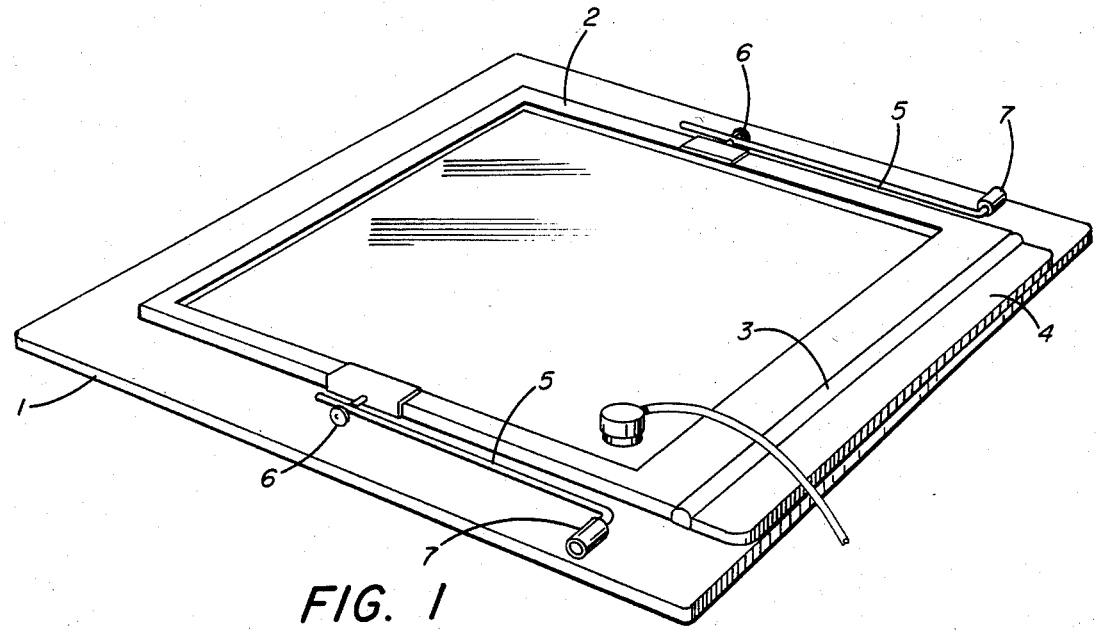
FIG. 1 is an isometric view of a photomask assembly in a closed position, incorporating features of the present invention.

A hinged photomask assembly with a movable arm for single operator use in accordance with the present invention is preferably produced by joining two glass photomask plates with a flexible polymeric hinge as disclosed in U.S. Pat. No. 4,412,739 to Freiberg, the disclosure of which is incorporated herein by reference. The hinged glass photomask plates may be separated by means of a vacuum gasket in accordance with the teachings of U.S. application Ser. No. 620,549 filed June 18, 1984 to Postupack et al, the disclosure of which is incorporated herein by reference. The vacuum gasket may be any suitable airtight, compressible material such as flexible tubing, weather stripping, or polymeric sealants such as butyl rubber. Evacuation of the space between the plates enclosed by the vacuum gasket is preferably accomplished by inserting a piece of tubing through the flexible polymeric hinge. One end of the tubing communicates with the space between the plates while the other end is connected to a vacuum pump capable of removing the air from the space between the plates. The tubing is preferably plastic, and may be inserted either through the flexible polymeric hinge material or through an aperture in one of the glass plates. The hinge material is preferably a silicone composition as described in U.S. Pat. No. 4,446,184 to Bowser, the disclosure of which is incorporated herein by reference. The movable arm which is used to hold the glass plates apart in accordance with the present invention may be any suitably rigid and durable material. Metals in general are suitable; stainless steel is preferred.

Since photomask assemblies are generally employed in a horizontal position with the bottom plate 1 stationary, the present invention is described in that orientation. The movable arm 5 of the present invention is preferably attached to the top plate 2, which is repeatedly raised and lowered in operation. The attachment of the top end of the movable arm 5 is preferably by means of a mounting 6 which permits pivoting of the arm. The bottom end of the arm is preferably free, but in contact with the bottom plate 1 or support. When the photomask assembly is in the closed position, the arm preferably lies substantially within the plane of the plates. As the top plate 2 is raised, the arm 5 pivots about the mounting 6, assuming an angled position with respect to the plates, resting on the bottom plate 1 or support, thereby holding the top plate 2 in the open position. In a preferred embodiment of the present invention, the top plate 2 is raised to a point at which the arm 5 is perpendicular to the bottom plate 1 or support. At this point, the top plate 2 is released, and is held in the open position by the arm 5, thereby freeing the operator to perform other tasks, such as removing an exposed substrate and inserting an unexposed substrate. The movable arm 5 of the present invention can support the top plate 2 at various angles by contacting a set point on the bottom plate or support. For example, a block or indentation may be positioned on the bottom plate or support to hold the arm in a given position, or the bottom end of the arm may travel in a groove in the bottom plate or support and come to rest at the end of such a groove.

In an alternative embodiment of the present invention, the top end of the arm need not pivot about a fixed mounting. Rather the arm may be designed to slide in a groove or track in the top plate. In another alternative embodiment of the present invention, the arm may be of a hinged design attached at one end to the top plate and at the other to the bottom plate. When the photomask assembly is in the closed position, the arm is in a closed (folded) position. As the top plate is raised, the hinged arm straightens, locking the plates in the open position. Various movable arm designs and means of attachment are included within the scope of the present invention. In addition to the preferred embodiment illustrated in FIGS. 1 and 2, another preferred embodiment utilizes a straight arm, with no right angled flange portions at the ends. The top end of the straight arm is attached to the top plate by means of a mounting pin which extends through an aperture in the arm, while the bottom end is unattached, and moves along the bottom plate or support preferably covered by a rubber or plastic tip which prevents both scratching of the bottom plate when the assembly is being opened or closed and slipping of the arm when the assembly is in the locked open position.

The construction of a photomask assembly in accordance with the present invention is accomplished by the following procedure. Two plates, preferably glass photomask plates, are joined together in a photomask assembly by means of a flexible polymeric hinge as described in U.S. Pat. No. 4,412,739 to Freiberg, the disclosure of which is incorporated herein by reference. To produce a vacuum frame photomask assembly, a vacuum gasket and vacuum means are supplied in accordance with the teachings of U.S. Ser. No. 620,549 filed June 18, 1984 by Postupack et al, the disclosure of which is incorporated herein by reference. The glass plates are precisely aligned with a preferred registration system as described in U.S. Pat. No. 4,445,775 to Tongel, the disclosure of which is incorporated herein by reference. The mounting for the movable arm of the present invention is preferably attached to the top plate with an adhesive such as Loctite ® Speed Bonder TM 324. Preferably, the arm is in place at the time the mounting is attached.

The photomask portion of the assembly may be a patterned coating of photographic emulsion, iron oxide, chromium, or silver halide emulsion or diazo film on either or both of the glass plates, or any conventional photomask material. However, it is preferred that one or both of the glass plates bear a photomask image in the form of a stain pattern within the glass plate. Detailed description of methods for forming glass photomasks which are preferred for use in accordance with the present invention are found in U.S. Pat. Nos. 4,144,066; 4,155,735; 4,390,592 and 4,407,891 to Ernsberger, the disclosures of which are incorporated herein by reference. In most preferred embodiments of the present invention wherein both glass plates are photomask plates, preferred hinge compositions are silicone polymers and, the silicone hinge is preferably employed in combination with a flexible, nonextensible layer as described in U.S. Pat. No. 4,446,184 to Bowser, the disclosure of which is incorporated herein by reference. The registration block alignment system is preferably stainless steel. The movable arm of the present invention and its mounting are preferably also stainless steel.

The present invention will be further understood from the descriptions of specific examples which follow.

EXAMPLE I

Figure 2:
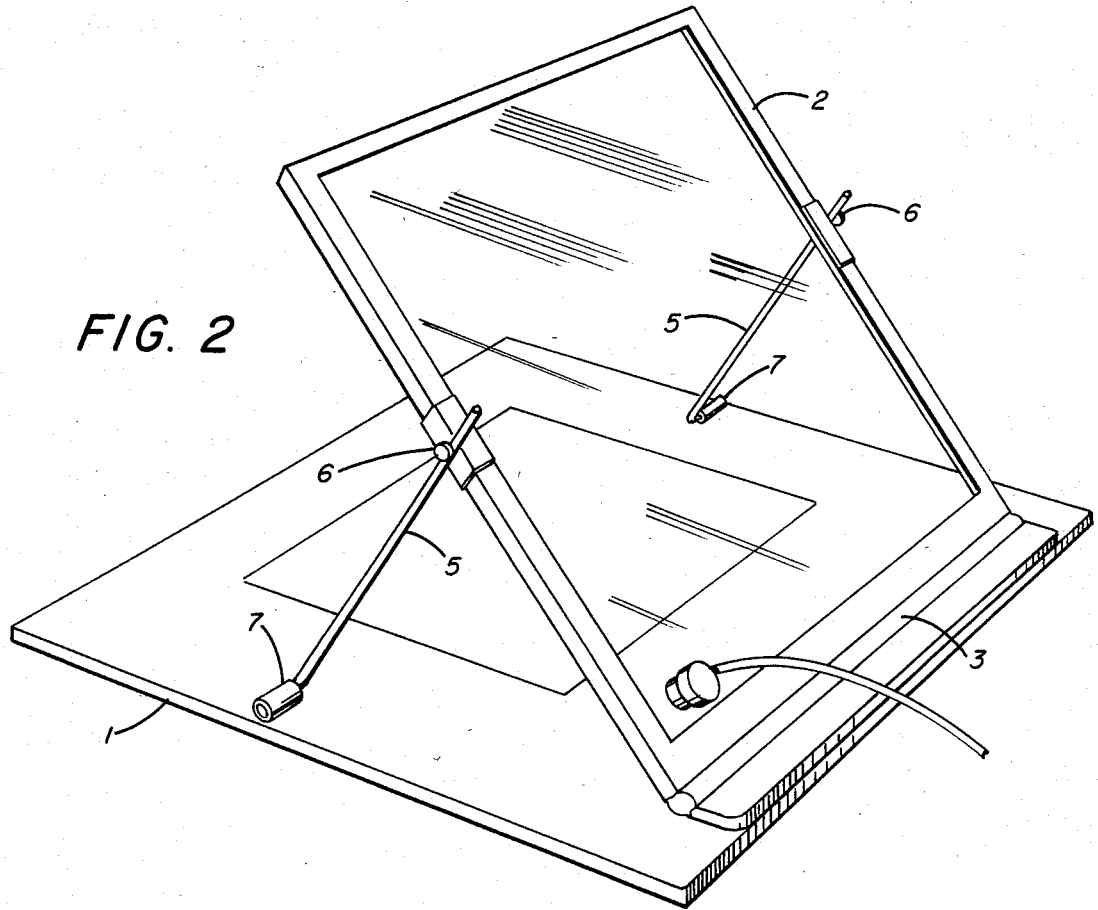
FIG. 2 is an isometric view of the photomask assembly of FIG. 1 locked in the open position in accordance with the teachings of the present invention.

A glass photomask measuring $14\frac{1}{4}$ by $11\frac{1}{2}$ inches (about 36 by 29 centimeters) is joined by means of a silicone hinge to a notched glass hinge plate $\frac{3}{4}$ inch (about 19 millimeters) wide. Registration blocks made of stainless steel are attached to the three free edges of the hinged glass photomask plate using an anaerobic acrylic adhesive, available as Loctite ® Speed Bonder TM 324 from Loctite Corporation, which cures at room temperature in about 5 minutes. A stainless steel arm mounting, with a movable arm pivotably mounted therein, is attached to one side of the hinged plate, again using the Loctite ® Speed Bonder TM 324. The movable arm is 3/16 inch (4.76 millimeters) diameter stainless steel. The straight portion, as shown in FIGS. 1 and 2 measures $4\frac{3}{4}$ inch (about 12 centimeters) with a perpendicular flange portion at each end measuring about $\frac{5}{8}$ inch (about 16 millimeters). The hinged glass photomask is then optically aligned in spaced facing relationship with a second glass photomask measuring $16\frac{1}{4}$ by $14\frac{1}{4}$ inches (about 41 by 37 centimeters), and the alignment fixed into position by attaching stainless steel block stops to positions on the bottom plate from which the block stops will engage the registration blocks on the top plate when the hinged top photomask and bottom photomask are brought into facing spaced relationship. The hinged top photomask is then joined to the bottom photomask by bonding the hinge plate to the bottom glass photomask while slightly compressing the silicone hinge. The adhesive used for bonding the hinge plate to the bottom photomask is a cyanoacrylate composition available from Loctite Corporation as Loctite ® 352, which cures upon exposure to ultraviolet radiation. The bottom flange portion of the movable arm rests on the extending perimeter portion of the slightly larger bottom plate. The bottom flange portion of the movable arm is covered with a rubber sleeve to prevent both scratching of the bottom plate and slipping of the arm when the top plate is raised and held in the open position by the arm which pivots into a vertical position perpendicular to and resting on the bottom plate.

EXAMPLE II

A photomask assembly is constructed as in Example I except that the movable arm is straight, with no flange portions. The top end is attached to the mounting by means of a pin which extends through an aperture in the arm and about which the arm pivots. The bottom end of the arm is covered by a rubber tip. When the top plate is lifted, the arm swings into a vertical position, perpendicular to the bottom plate and with its bottom end resting on the bottom plate thereby holding the top plate in the open position.

The above examples are offered to illustrate the present invention which includes various modifications. The movable arm of the present invention may be of various configurations, and may be mounted by various means so long as it is free to move from a position which does not interfere with the plates in the closed position to an angled position with respect to the plates is the open position. The arm and mounting, as well as the registration blocks and stops, may be formed in a variety of shapes, and of durable, rigid materials other than metals, such as plastics. In the preferred hinged glass photomask assemblies, flexible polymers other than silicone may be employed, may be cured by means other than heat, may be bonded to glass using primers, and may be bonded directly between two glass photomask plates without the preferred hinge plate, which need not be glass. While the space for the substrate to be processed is preferably defined by using the hinge material to offset the hinge plate, alternatives include using spacers, or blocks or stops with spacer portions. As previously mentioned, the photomask may be in any known form but is preferably a stained pattern in a glass plate. Any means of registration may be used to align a photoresist coated substrate within the hinged photomask assembly. Vacuum gaskets for use in evacuable assemblies may comprise any suitable air-tight, compressible material, and the evacuating means may be positioned through either the vacuum gasket or the glass plate instead of through the hinge. The scope of the present invention is defined by the following claims.

I claim:

1. In a photomask assembly article comprising a pair of glass plates joined by a flexible hinge, the improvement which comprises a movable arm having first and second ends, and means for attaching the first end of said arm to the top one of said plates whereby said arm does not interfere with said plates in a closed position and said arm is capable of achieving an angled position with respect to said plates when said top plate is raised in an open position wherein the second end of said arm rests on a stationary surface thereby holding said plates in said position.

2. An improved article according to claim 1, wherein said arm is pivotably mounted at one end to one of said plates.

3. An improved article according to claim 2, wherein said arm comprises a straight shaft portion with an angled portion at each end.

4. An improved article according to claim 3, wherein one angled portion is pivotally attached to a mounting on one of said plates, while the other angled portion freely contacts a surface of the other of said plates.

5. An improved article according to claim 2, wherein said arm consists of a straight shaft portion, one end of which is pivotally mounted on one plate and the other end of which freely contacts a surface of the other of said plates.

6. An improved article according to claim 1, wherein one of said plates is slightly narrower in width than the other, such that when said plates are in parallel facing relation, one plate has an extended side portion.

7. An improved article according to claim 6, wherein one end of said arm is pivotably mounted to the narrower sheet, while the other end freely contacts the extended side portion of the other sheet.

8. In a photomask assembly article comprising a pair of glass plates joined by a flexible hinge, the improvement which comprises a movable arm having first and second ends, and means for attaching the first end of the said arm to one of said plates whereby said arm does not interfere with said plates in a closed position and said arm is capable of achieving an angled position with respect to said plates in an open position wherein the second end of said arm rests on a stationary surface thereby holding said plates in said open position, wherein at least one of said plates is a stained glass photomask.

9. An improved article according to claim 8, wherein both of said plates are stained glass photomasks.

10. An improved article according to claim 9, wherein said plates are joined by a silicone hinge.

11. In a method for photolithographic imaging of a substrate comprising the steps of opening a photomask assembly comprising a hinged pair of plates, inserting a substrate between said plates, closing said assembly, exposing said substrate to actinic radiation, opening said assembly and removing the exposed substrate, the improvement which comprises providing said photomask assembly with a movable arm and attaching one end of said arm to one of said plates such that said arm does not interfere with said plates in a closed position and said arm achieves an angled position with respect to said plates in an open position with the other end of said arm resting on a stationary surface thereby holding said plates in said open position.

12. An improved method according to claim 11, wherein said arm is pivotally mounted at one end to one of said plates.

13. An improved method according to claim 12, wherein the other end of said arm freely contacts the other of said plates.

* * * * *